United States Patent [19]

Takeshita et al.

[11] Patent Number: 4,755,430
[45] Date of Patent: Jul. 5, 1988

[54] MAGNETIC BUBBLE MEMORY DEVICE

[75] Inventors: Masatoshi Takeshita, Hachioji; Hiroshi Umezaki, Koganei; Ryo Suzuki, Hachioji; Takashi Toyooka, Sayama; Teruaki Takeuchi, Koganei; Naoki Kodama, Tachikawa, all of Japan

[73] Assignee: Hitachi, Ltd., Tokyo, Japan

[21] Appl. No.: 12,171

[22] Filed: Feb. 9, 1987

[30] Foreign Application Priority Data

Feb. 7, 1986 [JP] Japan .................................. 61-23767

[51] Int. Cl.⁴ .............................................. G11C 19/08
[52] U.S. Cl. ................................... 428/411.1; 365/33; 427/131; 427/132; 428/415; 428/416; 428/447; 428/450; 428/458; 428/460; 428/473.5; 428/692; 428/900
[58] Field of Search ............... 428/692, 693, 694, 695, 428/475.5, 458, 460, 450, 447, 415, 416, 457, 411.1; 427/128, 132, 131; 365/65, 66, 33

[56] References Cited

U.S. PATENT DOCUMENTS

| 4,187,553 | 2/1980  | Ahn ......................... 427/131 |
| 4,317,700 | 3/1982  | Tanaka ...................... 427/131 |
| 4,369,209 | 1/1983  | Iwashimizu .................. 427/131 |
| 4,372,985 | 2/1983  | Bailey ....................... 427/131 |
| 4,407,859 | 10/1983 | Jones ........................ 427/131 |
| 4,470,873 | 9/1984  | Nakamura .................... 427/131 |
| 4,664,941 | 5/1987  | Washburn ..................... 427/131 |

Primary Examiner—Ellis P. Robinson
Attorney, Agent, or Firm—Antonelli, Terry & Wands

[57] ABSTRACT

A hybrid magnetic bubble memory device comprising soft magnetic material propagation tracks and ion-implanted propagation tracks. In the soft magnetic material propagation track region, a layer made of a heat-resistant polymer was provided as an interlaminar insulating layer between a conductor and a pattern of a soft magnetic material. An insulator film made of a heat-resistant polymer was provided on the pattern made of a soft magnetic material. A passivation film made of an inorganic material was provided on the ion-implanted propagation tracks and the insulator film made of a heat-resistant polymer.

6 Claims, 1 Drawing Sheet

MAGNETIC BUBBLE MEMORY DEVICE

BACKGROUND OF THE INVENTION

This invention relates to a magnetic bubble memory device. More particularly, the present invention is concerned with a magnetic bubble memory device having a decreased stress on patterns made of soft magnetic materials and an improved adhesion of a passivation film.

It has been a usual practice in a conventional magnetic bubble memory device to form a passivation film 6 directly on the pattern 5 using $SiO_2$ which is an inorganic matter after formation of a pattern 5 made of a soft magnetic material as shown in FIG. 1. In this case, the coercive force Hc of the pattern 5 made of a soft magnetic material increases due to the influence of stress of the $SiO_2$ passivation film 6. Such an influence becomes remarkable with the reduction in magnetic bubble diameter and reduction in minimum feature of patterns made of soft magnetic materials, which causes the propagation margin of the magnetic bubble to be degraded. The same is true in a hybrid magnetic bubble memory device comprising hybrid type tracks composed of ion-implanted propagation tracks and soft magnetic material propagation tracks. Specifically, in a hybrid magnetic bubble memory device, the formation of a passivation film 6 made of $SiO_2$ after the formation of the pattern 5 made of a soft magnetic material as shown in FIG. 2 bring about an increase in coercive force Hc of the pattern 5 made of a soft magnetic material as in the above-mentioned magnetic bubble memory device, which is a major causative factor of the degradation of the propagation margin. In this connection, it is noted that, since the hybrid magnetic bubble memory device uses ion-implanted propagation tracks in its minor loop, the major part of the device comprises the ion-implanted track. Therefore, the hybrid magnetic bubble memory device has a large area where a second insulator film 4 is in direct contact with the $SiO_2$ passivation film 6. In order to reduce the step caused in the pattern 5 made of a soft magnetic material which crosses a conductor pattern 3, a heat-resistant polymer has been used as the second insulator film 4. Examples of the heat-resistant polymer include a polyimide resin, an epoxy resin, a phenolic resin, a polycarbonate resin, a polyamide-imide resin, a polybenzimidazole resin and a silicone resin. However, since such heat-resistant polymers are poor in adhesion to $SiO_2$, there arises a large problem of reliability.

In order to eliminate the above problem related to the adhesion, Japanese Patent Laid-Open No. 28517/1980 has proposed to use a resin as the passivation film. Although the use of the resin as the passivation film improves the adhesion to the second insulator film, the passivation film comprising the resin is poor in protective ability against mechanical shock and environmental humidity, which makes a device unsuitable for a practical use.

As is apparent from the foregoing, the above-mentioned conventional magnetic bubble memory devices had problems with respect to the stress or adhesion of the passivation film and, therefore, had disadvantages such as degradation of the propagation margin and poor reliability.

SUMMARY OF THE INVENTION

It is an object of the present invention to provide a magnetic bubble memory device having a decreased influence of the stress of the passivation film on the pattern made of a soft magnetic material and an improved adhesion of the passivation film.

According to the present invention, the influence of stress of a passivation film made of an inorganic matter such as $SiO_2$ on the pattern made of a soft magnetic material can be decreased by providing a heat-resistant polymer layer as a third insulator film between the pattern made of a soft magnetic material and the passivation film made of an inorganic matter such as $SiO_2$. In this connection, it is noted that, when a heat-resistant polymer layer is formed on the entire surface of the device after the formation of the pattern made of a soft magnetic material and a passivation film made of $SiO_2$ is formed thereon, the passivation film tends to peel off the heat-resistant polymer layer because of a poor adhesion between the polymer and $SiO_2$, leading to a problem related to reliability. The present inventors have found that such a problem can be solved by the following method. In a hybrid magnetic bubble memory device comprising hybrid type tracks composed of ion-implanted propagation tracks and soft magnetic material propagation tracks, the ion-implanted propagation tracks are used in the minor loop portion constituting the major part of the device. The ion-implanted propagation tracks do not undergo any influence of the stress of the passivation film made of $SiO_2$. Therefore, the formation of the passivation film made of $SiO_2$ after removal of the second and third insulator films at its portions located over the ion-implanted track region and the circumference of the device provides a direct contact of the passivation film made of $SiO_2$ with a first insulator film made of $SiO_2$ in the major part of the device, which contributes to an improvement in adhesion of the passivation film. Further, in this case, since the pattern made of a soft magnetic material is covered with a heat-resistant polymer layer which is the third insulator film, the influence of the stress of the passivation film made of $SiO_2$ on the pattern made of a soft magnetic material can be decreased. Therefore, the increase in coercive force Hc of the pattern made of a soft magnetic material can be prevented, leading to the prevention of degradation of the propagation margin of the magnetic bubble memory device.

DETAILED DESCRIPTION AND PREFERRED EMBODIMENT OF THE PRESENT INVENTION

One embodiment of the present invention will now be described with reference to the process diagrams as shown in FIG. 3.

Figure 1:
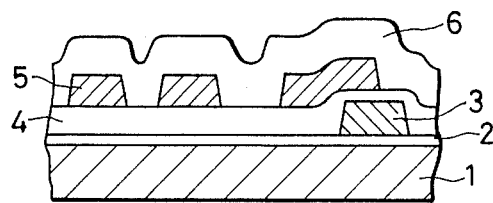
FIG. 1 is a cross-sectional view of a conventional magnetic bubble memory device having soft magnetic material propagation tracks.
Figure 2:
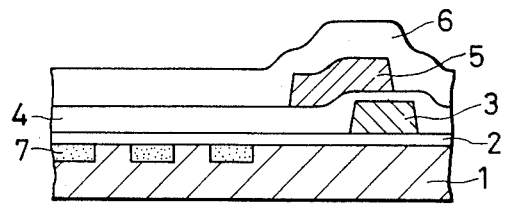
FIG. 2 is a cross-sectional view of a conventional hybrid magnetic bubble memory device.
Figure 3A:
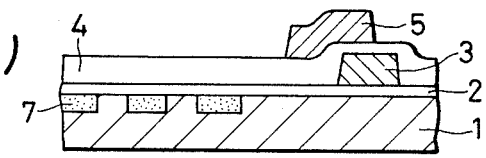
FIG. 3(a–d) represent cross-sectional views of a process for forming a hybrid magnetic bubble memory device of the present invention.

As shown in FIG. 3(a), ion-implanted propagation tracks were formed in a magnet garnet film 1 supporting a magnetic bubble, and a 1000 Å-thick $SiO_2$ film was then formed thereon as a first insulator film 2. Subsequently, a 3500 Å-thick Au/Mo dual layer was formed as a conductor film 3 on the first insulator film 2, followed by formation of a pattern. Thereafter, a 3500

Figure 3B:
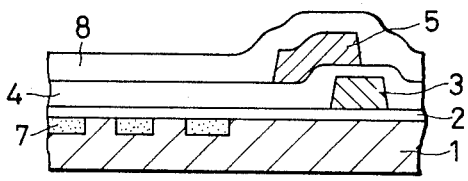
Figure 3C:
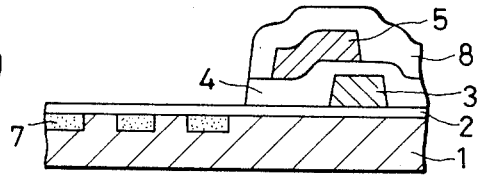
Figure 3D:
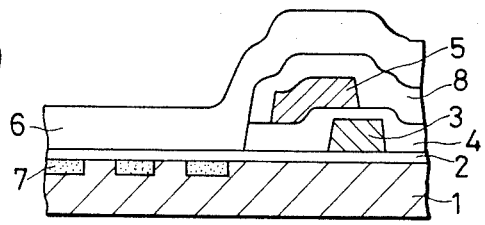

Å-thick layer of a polyimide resin as a heat-resistant polymer was applied thereto as a second insulator film 4, followed by formation of a 3500 Å-thick soft magnetic material as a pattern 5 made of a soft magnetic material. A polyimide resin was then applied in a thickness of 3000 Å as a third insulator film 8 on the entire surface, as shown in FIG. 3(b). The second and third insulator films at the portions located over the ion-implanted propagation regions constituting a minor loop and circumferential regions of the device were removed by means of physical etching, as shown in FIG. 3(c). Finally, a 1 μm-thick passivation film 6 was formed using $SiO_2$, as shown in FIG. 3(d).

In the present embodiment, a major line-minor loop hybrid magnetic bubble memory device in which a minor loop bit period was 3 μm while a major line bit period was 14 μm was prepared using a $(YSmLuGd)_3(FeGa)_5O_{12}$ garnet film (film thickness: 0.9 μm; bubble diameter: about 0.9 μm). When a rotating magnetic field of 500 e or more was applied in plane with a drive frequency of 200 kHz, the bias field margin was as high as 10% or higher on the average.

Although a polyimide resin was used in this embodiment as the third insulator film 8, other various resins may also be used. Examples of such resins include an epoxy resin, a phenolic resin, a polycarbonate resin, a polyamide-polyimide resin, a polybenzimidazole resin and a silicone resin. In this connection, it is preferred that the third insulator film 8 can withstand a temperature of 300° C. or higher.

Table 1 given below shows the adhesion between the polyimide resin which is a heat-resistant polymer and the passivation film made of $SiO_2$ which is an inorganic matter and the adhesion between the first insulator film made of $SiO_2$ and the passivation film made of $SiO_2$.

The adhesion as indicated in Table 1 was determined by the peel test method.

TABLE

| No. | Combination of films tested | Adhesion |
| --- | --- | --- |
| 1 | second insulator film made of polyimide resin and passivation film made of $SiO_2$ | 10 g/cm |
| 2 | first insulator film made of $SiO_2$ and passivation film made of $SiO_2$ | 300 g/cm |

As is seen from Table 1, the adhesion between the first insulator film made of $SiO_2$ and the passivation film made of $SiO_2$ is extremely large as compared with the adhesion between the second insulator film made of a polyimide resin and the passivation film made of $SiO_2$.

In this connection, it is noted that the adhesion between a film made of a heat-resistant polymer other than the polyimide resin including an epoxy resin and the passivation film made of $SiO_2$ is substantially the same as the adhesion between the second insulator film made of a polyimide resin and the passivation film made of $SiO_2$ as indicated in No. 1 of Table 1. Further, when an inorganic matter other than $SiO_2$ is used instead of $SiO_2$, the adhesion is substantially the same as those indicated in Nos. 1 and 2 of Table 1.

As mentioned above, in a hybrid magnetic bubble memory device, a minor loop comprising ion-implanted propagation tracks occupies a large area of the device. According to the present invention, the ion-implanted regions where such ion-implanted propagation tracks have been formed have a first insulator film thereon on which a passivation film made of an inorganic matter has been directly formed. Therefore, since the major regions of the chip have a high adhesion, the adhesion of the whole chip is sufficient for a practical use.

As is apparent from the foregoing, according to the present invention, since not only the influence of the stress of a passivation film made of an inroganic matter on the pattern made of a soft magnetic material can be decreased but also the adhesion of the passivation film made of an inorganic matter can be improved, the bias field characteristics and reliability of a hybrid magnetic bubble memory device can be improved.

What is claimed is:

1. In a magnetic bubble memory device comprising:
   a magnetic film capable of supporting a magnetic bubble;
   a first insulator film made of an inorganic material;
   a first magnetic bubble propagation track region comprising a conductor pattern, a second insulator film made of a heat-resistant polymer and a pattern made of a soft magnetic material formed on said second insulator film;
   a second magnetic bubble propagation track region having ion-implanted propagation tracks which have been formed by selectively implanting an ion into desired regions in said magnetic film;
   the improvement wherein a third insulator film made of a heat-resistant polymer is provided on said second insulator film and said pattern made of a soft magnetic material; and
   wherein a passivation film made of an inorganic material is provided on said third insulator film and said first insulator film at portions of the first insulator film located in said second magnetic bubble propagation track region.

2. A magnetic bubble memory device according to claim 1, wherein said heat-resistant polymer is at least one member selected from the group consisting of a polyimide resin, an epoxy resin, a phenolic resin, a polycarbonate resin, a polyamide-imide resin, a polybenzimidazole resin and a silicone resin.

3. A magnetic bubble memory device according to claim 1, wherein said inorganic material is $SiO_2$.

4. A magnetic bubble memory device according to claim 1, wherein the device has a decreased influence of stress of said passivation film on said pattern of soft magnetic material and an improved adhesion of said passivation film.

5. A magnetic bubble memory device comprising:
   a magnetic film supporting magnetic bubbles;
   a first magnetic bubble propagation track region comprising ion-implanted propagation tracks formed by selectively implanting ions into desired portions of said magnetic film, and a first insulator film made of $SiO_2$ on said magnetic film;
   a second magnetic bubble propagation track region comprising said first insulator film on said magnetic film, conductor patterns on said first insulator film, a second insulator film made of a heat-resistant polymer on said conductor patterns, soft magnetic material patterns on said second insulator film and a third insulator film made of a heat-resistant polymer on said second insulator film and said soft magnetic material patterns; and
   a passivation film made of $SiO_2$ on said first insulator film in said first magnetic bubble propagation track region, and on said second insulator film and said third insulator film in said second magnetic bubble propagation track region.

6. A magnetic bubble memory device according to claim 5, wherein said heat-resistant polymer is at least one member selected from the group consisting of a polyimide resin, an epoxy resin, a phenolic resin, a polycarbonate resin, a polyamide-imide resin, a polybenzimidazole resin and a silicone resin.

* * * * *